(12) United States Patent
Kikuyama et al.

(10) Patent No.: US 7,033,563 B2
(45) Date of Patent: Apr. 25, 2006

(54) METHOD FOR REDUCING OXYGEN COMPONENT AND CARBON COMPONENT IN FLUORIDE

(75) Inventors: Hirohisa Kikuyama, Osaka-fu (JP); Hirofumi Yazaki, Osaka-fu (JP); Tomohiko Satonaga, Osaka-fu (JP)

(73) Assignee: Stella Chemifa Kabushiki Kaisha, Osaka (JP)

( * ) Notice: Subject to any disclaimer, the term of this patent is extended or adjusted under 35 U.S.C. 154(b) by 340 days.

(21) Appl. No.: 10/467,697

(22) PCT Filed: Feb. 7, 2002

(86) PCT No.: PCT/JP02/01033
§ 371 (c)(1),
(2), (4) Date: Aug. 8, 2003

(87) PCT Pub. No.: WO02/063076
PCT Pub. Date: Aug. 15, 2002

(65) Prior Publication Data
US 2004/0062696 A1 Apr. 1, 2004

(30) Foreign Application Priority Data
Feb. 8, 2001 (JP) .................................... 2001-032740

(51) Int. Cl.
*C01B 7/07* (2006.01)
*C01B 9/08* (2006.01)
*C01B 23/00* (2006.01)

(52) U.S. Cl. .................. 423/489; 423/262; 423/263; 423/490

(58) Field of Classification Search ............... 423/489, 423/490, 262, 263
See application file for complete search history.

(56) References Cited

U.S. PATENT DOCUMENTS
6,146,456 A * 11/2000 Mizugaki et al. ............. 117/2

FOREIGN PATENT DOCUMENTS
| JP | 2000-226297 | | 8/2000 |
| JP | 2000-281492 | | 10/2000 |
| JP | 2000-281492 A | * | 10/2000 |
| WO | PCT/JP02/01033 | | 2/2002 |

OTHER PUBLICATIONS

The American Heritage College Dictionary, 4$^{th}$ edition, p. 57.*

* cited by examiner

*Primary Examiner*—David W. Wu
*Assistant Examiner*—Ives Wu
(74) *Attorney, Agent, or Firm*—Randall J. Knuth

(57) ABSTRACT

A method for reducing oxygen and carbon components in high-purity fluoride such as calcium fluoride and barium fluoride (a high-purity fluoride that is not limited to calcium fluoride and barium fluoride), or in rare-earth fluorides such as ytterbium fluoride and cerium fluoride used for an optical fiber, a coating material, and so on. The oxygen and carbon components contained in the high-purity fluoride are reduced by a fluorine gas treatment.

13 Claims, No Drawings

METHOD FOR REDUCING OXYGEN COMPONENT AND CARBON COMPONENT IN FLUORIDE

BACKGROUND OF THE INVENTION

1. Field of the Invention

The present invention relates to a method for reducing an oxygen component and a carbon component in fluoride.

2. Description of the Related Art

A lithographic process in the manufacture of a semiconductor is applied on an optical-purpose material such as a raw material of an optical system that constitutes a stepper device provided as an exposure device (e.g., a projective lens or an illumination lens) or a raw material, e.g., an optical fiber material or a coating material.

For instance, in the case of a lens material, an ArF excimer laser (193 nm) which is an exposure source of light having a short wavelength and an F2 excimer laser (157 nm) having an even shorter wavelength, have been used in connection with high integration semiconductor manufacturing. However, since a high-purity silica glass provided as a lens and typically used heretofore has a poor transmittance, it should not be used. Thus, fluorides such as calcium fluoride and barium fluoride, which have good transmittance properties even at short wavelength and strong laser durability, have been considered for use. Yet, a high purity monocrystal is absolutely essential for the manufacture of a fluoride lens made of calcium fluoride, barium fluoride, or the like. It has been known that various kinds of problems may be caused when an excess amount of oxygen or carbon is included as an impurity in the raw material.

The oxygen component, which may be incorporated into fluoride as moisture, can remain at the time of the manufacture, or an oxide is generated by the process of sintering, so that finally, at the time of lens formation. As such, (1) a reduction in transmittance, (2) a reduced laser durability, (3) a change coloring, and/or another change may be induced by the presence of oxygen. Thus, it has been said that the presence of oxygen can influence the transmittance of light. Therefore, a low concentration of oxygen in the fluoride component has been desired.

The carbon component can be caused from a crucible material at the time of sintering. Typically, an alumina crucible or a carbon crucible is used. When the alumina crucible is used, contamination with aluminum may occur. In general, therefore, the carbon crucible is used. However, carbon from a crucible material may remain in the fluoride. In the process of manufacturing the fluoride, furthermore, unreacted carbon (e.g., from carbonate as a raw material) generally used at the time of manufacturing the fluoride may remain in the product. This remaining carbon material in the fluoride product is said to be incorporated into a monocrystal at the time of manufacturing and tends to exert an adverse effect on coloring or the like.

Actually, at the time of manufacturing the monocrystal, the oxygen component is generally used as a scavenger where lead fluoride or zinc fluoride is used as a reactant. For instance, the lead fluoride performs a deoxidization process of the following reaction (A):

$$CaO + PbF_2 \rightarrow CaF_2 + PbO \ldots \quad (A).$$

The deoxidization process of the above (A) permits a decrease in the amount of oxygen. However, as the scavenger is added as a second component, the potential contamination generated therefrom makes the formation of a pure monocrystal essentially impossible. For minimizing the amount of the added scavenger as much as possible, there is a need of fluoride containing a smaller amount of the oxygen component in the raw material.

SUMMARY OF THE INVENTION

The present invention provides a method for reducing an oxygen component and a carbon component in a fluoride material/product, the method being capable of lowering the amounts of oxygen and carbon in the fluoride by a simple process.

The present invention relates to a method for reducing an oxygen component and a carbon component in a fluoride, characterized by performing a fluorine gas treatment in which the fluoride is brought into a contact with gas containing fluorine gas.

DETAILED DESCRIPTION OF THE INVENTION

The present invention sets forth a method capable of reducing carbon in addition to reducing oxygen which is an impurity contained in a fluoride product by subjecting calcium fluoride, barium fluoride, or the like (provided as for example a lens raw material) to a fluoride gas treatment as a secondary treatment. It is found that such a method is capable of reducing oxygen and carbon concentrations by simply introducing fluorine gas as a secondary treatment on a conventional product and mixing those together. The fluorine gas is a gas having a strong oxidizing ability. It is thought that an oxygen component and a carbon component in the impurities may be reduced by the following reactions. However, at the present, a distinct reaction mechanism has not been revealed.

$$O + F_2 \rightarrow OF_2 \uparrow \quad (B)$$

$$C + F_2 \rightarrow CF_4 \uparrow \quad (C)$$

For the conditions of the secondary treatment with fluorine gas, the effects of low oxygen and low carbon are obtainable without depending on the concentration of fluorine. Preferably, 5 to 50% fluoride gas content (inert gas such as nitrogen or argon gas is provided for diluting gas) is advantageously used in terms of industry and handling.

Regarding the processing temperature as a matter of course, in addition, activation energy decreases as the temperature increases. A higher temperature is therefore advantageous for the reaction. In the case of processing under a higher temperature, there is a need of using a reactor make of a metal material. For reducing the generation of contamination from the reactor, the temperatures under which a polymer material such as a fluorocarbon resin can be reduced is preferable in terms of handling. Furthermore, at a room temperature, the effects of low oxygen and low carbon were obtained.

By the way, the concentration of the fluorine gas may be 100%, or may be diluted with inert gas. At this time, the concentration of fluorine gas may be preferably 5 to 50%. The inert gas available for the dilution includes, for example, nitrogen, argon, and neon. It is preferable that the inert gas may be of a high purity with an impurity (e.g., moisture and/or oxygen) concentration of 10 ppb or less.

The fluoride may be preferably a rare-earth fluoride. Specifically, it is one or more selected from calcium fluoride, barium fluoride, ytterbium fluoride, and cerium fluoride.

A fluoride gas treatment is preferably performed at a room temperature to 350° C, more preferably 200 to 300° C.

The fluoride material is favorably used as an optical material to be provided as a raw material of an optical system (e.g., projector lens or illumination lens) that constitutes an exposure device to be used in the process of lithography, an optical fiber material, a coating material, or the like.

The external shape of the fluoride is not specifically limited. Preferably, however, the fluoride is shaped in the form of powders, granules, or particles.

The diameter thereof is preferably 1 mm or less, more preferably 1 to 500 μm, and still more preferably 10 to 200 μm.

The duration of fluorination is, preferably, from 30 seconds to 1 hour, depending on the temperature. The duration is more preferably from 1 to 30 minutes, and still more preferably of 1 to 10 minutes because the effects can become saturated in an even longer duration. The longer duration can cause the saturation of effects.

BEST MODE FOR CARRYING OUT THE INVENTION

[Example 1]

A purification treatment was performed by placing 300 g of high-purity calcium in a 5L-PFA container and sufficiently mixing the powders and gas while feeding the flow of gas based on each of 5, 10, 25, and 50% of fluorine gas/$N_2$ for 5 minutes at room temperature. The treated product was then subjected to analyses for oxygen and carbon using an oxygen analyzer and a carbon analyzer, respectively (Table 1).

TABLE 1

The results of Example 1 (Secondary treatment at room temp.)

| | Oxygen (ppm) | | | | Carbon (ppm) | | | |
|---|---|---|---|---|---|---|---|---|
| $F_2$ concentration (%) | 5 | 10 | 25 | 50 | 5 | 10 | 25 | 50 |
| Before $F_2$ gas treatment | 140 | 145 | 145 | 140 | 30 | 35 | 35 | 30 |
| After $F_2$ gas treatment | 80 | 85 | 80 | 80 | <5 | <5 | <5 | <5 |

From the results described above, reductions of oxygen and carbon could be confirmed by means of the secondary treatment without depending on the respective 5, 10, 25, and 50% fluorine gas concentrations. Furthermore, the effects could be found even at room temperature, and this finding would have large industrial merits.

[Example 2]

In the same way as that of Example 1, a purification treatment was performed by placing 300 g of high-purity calcium in a 5L-PFA container, maintaining a reaction container at 100° C, and sufficiently mixing the powders and gas while feeding the flow of gas based on each of 5, 10, 25, and 50% of fluorine gas/$N_2$ gas for 5 minutes, followed by oxygen and carbon analyses, respectively (Table 2).

TABLE 2

The results of Example 2 (Secondary treatment at 100° C.)

| | Oxygen (ppm) | | | | Carbon (ppm) | | | |
|---|---|---|---|---|---|---|---|---|
| $F_2$ concentration (%) | 5 | 10 | 25 | 50 | 5 | 10 | 25 | 50 |
| Before $F_2$ gas treatment | 140 | 145 | 145 | 140 | 30 | 35 | 35 | 30 |
| After $F_2$ gas treatment | 80 | 85 | 80 | 80 | <5 | <5 | <5 | <5 |

From the results described above, reductions of oxygen and carbon were confirmed by means of the respective 5, 10, 25, and 50% fluorine gas concentration treatments. Furthermore, the reduction effects were found enhanced when the treatment temperature was increased.

[Example 3]

The same experiment as shown in Example 1 was performed using rare-earth fluoride such as ytterbium fluoride or cerium fluoride to be used as an optical fiber material or a coating material, for example, ytterbium fluoride. A purification treatment was performed by placing 300 g of ytterbium fluoride in a 5L-PFA container and mixing the powders and gas while feeding the flow of gas based on each of 5, 10, 25, and 50% of fluorine gas/$N_2$ gas for 5 minutes at room temperature.

The treated product was then subjected to analyses for oxygen and carbon using an oxygen analyzer and a carbon analyzer, respectively (Table 3).

TABLE 3

The results of Example 1 (Secondary treatment at room temp.)

| | Oxygen (ppm) | | | | Carbon (ppm) | | | |
|---|---|---|---|---|---|---|---|---|
| $F_2$ concentration (%) | 5 | 10 | 25 | 50 | 5 | 10 | 25 | 50 |
| Before $F_2$ gas treatment | 800 | 800 | 850 | 830 | 30 | 35 | 35 | 30 |
| After $F_2$ gas treatment | 150 | 130 | 180 | 150 | <5 | <5 | <5 | <5 |

From the results described above, the effects of low oxygen and low carbon were obtained just as in the case of calcium fluoride in Example 1. Likewise, furthermore, the effects of low oxygen and low carbon were obtained by increasing the treatment temperature of Example 2.

[Example 4]

A secondary treatment was performed by placing 300 g of a high-purity calcium fluoride of Example 1 in a heat-resisting metallic container, for example, a nickel container (a stainless container may also be used) and introducing 100% fluorine gas at 300° C for 5 minutes.

The treated product was then subjected to analyses for oxygen and carbon using an oxygen analyzer and a carbon analyzer, respectively (Table 4).

TABLE 4

The results of Example 4 (Secondary treatment at 300° C.)

| | Oxygen (ppm) | Carbon (ppm) |
|---|---|---|
| Before $F_2$ gas treatment | 145 | 30 |
| After $F_2$ gas treatment | 70 | <5 |

From the results described above, using 100% fluorine gas, and also in the treatment at a high temperature of 300° C, the effects of low oxygen and low carbon were confirmed.

INDUSTRIAL APPLICABILITY

The present invention allows: the refinement of oxygen and carbon, for example, which are impurities in a high-purity calcium fluoride known as a typical raw material used for a stepper lens for an ArF or F2 excimer-laser in the photolithographic process during the manufacture of a semiconductor; a reduction in the adding amount of a scavenger in the deoxidization during the manufacture of a monocrystal; and a reduction in various kinds of problems. Furthermore, in recent years, thin-film technologies have been progressed. There is a need of a low-oxygen, high-purity fluoride, and there is a possibility of its availabilities in many other fields.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A method for reducing an oxygen component and a carbon component in a fluoride, comprising the step of performing a fluorine gas treatment in which the fluoride is brought into contact with a gas that contains fluorine gas, the fluoride being treated being in a form of a raw material fluoride.

2. A method for reducing an oxygen component and a carbon component in the fluoride as described in claim 1, wherein the concentration of fluorine gas in the gas containg fluorine gas is 5 to 50%.

3. A method for reducing an oxygen component and a carbon component in the fluoride as described in claim 1, wherein the gas that contains the fluorine gas is a gas prepared by diluting fluorine gas with an inert gas.

4. A method for reducing an oxygen component and a carbon component in the fluoride as described in claim 1, wherein the fluoride is a rare-earth fluoride.

5. A method for reducing an oxygen component and a carbon component in the fluoride as described in claim 1, wherein the fluoride is composed of at least one of the following materials: calcium fluoride, barium fluoride, ytterbium fluoride, and cerium fluoride.

6. A method for reducing an oxygen component and a carbon component in the fluoride as described in claim 1, wherein the fluorine gas treatment is performed in a range of room temperature to 350° C.

7. A method for reducing an oxygen component and a carbon component in the fluoride as described in claim 6, wherein the fluorine gas treatment is performed at 200 to 300° C.

8. A method for reducing an oxygen component and a carbon component in the fluoride as described in claim 1, wherein the fluoride is a fluoride used for an optical material.

9. A method for reducing an oxygen component and a carbon component in the fluoride as described in claim 1, wherein the raw-material fluoride is in the form of at least one of a powder, granules, and particles.

10. A method for reducing an oxygen component and a carbon component in the fluoride as described in claim 9, wherein the diameter of the fluoride is 1 mm or less.

11. A method for reducing an oxygen component and a carbon component in the fluoride as described in claim 10, wherein the diameter of the fluoride is in a range of 10 to 200 µm.

12. A method for reducing an oxygen component and a carbon component in the fluoride as described in claim 1, wherein a fluorination time is in the range of 30 seconds to 1 hour.

13. A method for reducing an oxygen component and a carbon component in the fluoride as described in claim 12, wherein the fluorination time is in the range of 1 to 10 minutes.

* * * * *